(12) United States Patent
Huang

(10) Patent No.: US 6,395,564 B1
(45) Date of Patent: May 28, 2002

(54) METHOD FOR FABRICATING A LIGHT-EMITTING DEVICE WITH UNIFORM COLOR TEMPERATURE

(75) Inventor: Wen-Chieh Huang, Taipei (TW)

(73) Assignee: Arima Optoelectronics Corp., Taoyuan (TW)

( * ) Notice: Subject to any disclaimer, the term of this patent is extended or adjusted under 35 U.S.C. 154(b) by 0 days.

(21) Appl. No.: 09/897,636

(22) Filed: Jul. 3, 2001

(30) Foreign Application Priority Data

Feb. 12, 2001 (TW) ........................................ 90103012 A

(51) Int. Cl.⁷ ............................................. H01L 21/00
(52) U.S. Cl. .......................................................... 438/7
(58) Field of Search ................................ 438/35, 7, 34, 438/6, 25–28, 810

(56) References Cited

U.S. PATENT DOCUMENTS 6,222,172 B1 * 4/2001 Fossum et al. ............. 250/205

* cited by examiner

*Primary Examiner*—Charles Bowers
*Assistant Examiner*—Craig Thompson
(74) *Attorney, Agent, or Firm*—Birch, Stewart, Kolasch & Birch, LLP

(57) ABSTRACT

The invention provides a method for fabricating a light-emitting diode with uniform color temperature, comprising the steps of: forming a plurality of light-emitting diodes on a wafer; obtaining the light emission wavelengths of the light-emitting diodes on the wafer; and forming different doses of phosphor on the corresponding light-emitting diode on the wafer according to the light emission wavelengths of respective light-emitting diodes. Finally, the light-emitting diodes on the wafer emit light with uniform color temperature.

16 Claims, 7 Drawing Sheets

METHOD FOR FABRICATING A LIGHT-EMITTING DEVICE WITH UNIFORM COLOR TEMPERATURE

BACKGROUND OF THE INVENTION

1. Field of the Invention

The invention relates to a method for fabricating a light-emitting device. More particularly, the method provides a wafer with light-emitting devices, and obtains the wavelengths of every light-emitting device. It then forms different doses of phosphor on the light-emitting devices according to their wavelengths, and obtains the light-emitting devices with uniform color temperature.

2. Description of the Related Art

FIGS. 1A to FIG. 1G illustrate a conventional method of fabricating a light-emitting device. As shown in FIG. 1A, an n-type cladding layer 19 is formed on an insulating substrate 18 in the semiconductor process. Next, as shown in FIG. 1B, a p-type cladding layer 22 is formed on the n-type cladding layer 19. Next, as shown in FIG. 1C, a p-type electrode 17 is formed on the p-cladding layer 22 and a n-type electrode 14 is formed on the n-type cladding layer 19. Next, as shown in FIG. 1D, a plurality of segment lines L for obtaining a plurality of light-emitting die by cutting thereon is formed on the wafer. Next, as shown in FIG. 1E, the light-emitting die is positioned on a first lead frame 12. A first wire 21 connects the p-type electrode 17 and a second lead frame 13, and a second wire 23 connects the n-type electrode 14 and the first lead frame 12. Next, as shown in FIG. 1F, a phosphor layer is formed on the light-emitting device 32. Finally, as shown in FIG. 1G, the light-emitting device 32 is molded in resin 34.

In the conventional method, the dose and composition of the phosphor layer that is formed on each die is substantially the same. However, each light-emitting die can not emit the same wavelength even though the dies were formed on the same wafer by the same semiconductor process. A part of the first wavelength emitted from the light-emitting die is transformed into a second wavelength, which is longer than the first wavelength, by the phosphor. Because of the same dose and composition of the phosphor layer and the different first wavelengths, the second wavelengths emitted from each die aren not the same. Furthermore, the superposed wavelength of the first and second wavelengths from each light-emitting device would not be the same. In other words, each light-emitting device can not have uniform color temperature. Therefore, the yield of the light-emitting devices on a wafer is only 10%.

SUMMARY OF THE INVENTION

To solve the above problems, it is an object of the present invention to provide a method for fabricating a light-emitting diode with uniform color temperature, comprising the steps of: forming a plurality of light-emitting diodes on a wafer; obtaining the light emission wavelengths of the light-emitting diodes on the wafer; and forming different doses of phosphor on the corresponding light-emitting diode on the wafer according to the light emission wavelengths of respective light-emitting diodes. Finally, the light-emitting diodes on the wafer emit light with uniform color temperature.

It is another object of the invention to provide a method for fabricating a light-emitting device with uniform color temperature, comprising the steps of: forming a plurality of light-emitting diodes on a wafer; obtaining the light emission wavelengths of the light-emitting diodes on the wafer; forming different doses of phosphor on the corresponding light-emitting diode on the wafer according to the light emission wavelengths of respective light-emitting diodes, so as to provide the light-emitting diodes on the wafer with uniform color temperature; dividing the light-emitting diodes on the wafer into a plurality of light-emitting dies with uniform color temperature; and obtaining the light-emitting device with uniform color temperature by packaging the respective light-emitting die.

It is another object of the invention to provide a method for fabricating a white LED with uniform color temperature, comprising the steps of: forming a plurality of UV/blue LEDs on a wafer; obtaining the light emission wavelengths of the UV/blue LEDs on the wafer; and forming different doses of phosphor on the corresponding UV/blue LED on the wafer according to the light emission wavelengths of respective UV/blue LEDs, so as to provide the white LEDs with uniform color temperature on the wafer.

It is another object of the invention to provide a method for fabricating a white light-emitting device with uniform color temperature, comprising the steps of: forming a plurality of UV/blue LEDs on a wafer; obtaining the light emission wavelengths of the UV/blue LEDs on the wafer; forming different doses of phosphor on the corresponding UV/blue LED on the wafer according to the light emission wavelengths of respective UV/blue LEDs, so as to provide the white LEDs with uniform color temperature on the wafer; dividing the white LEDs on the wafer into a plurality of white light-emitting dies with uniform color temperature; and obtaining the white light-emitting device with uniform color temperature by packaging the respective white light-emitting die.

The invention has a feature of forming different doses of phosphor on the corresponding light-emitting diode. The superposed wavelengths of each light-emitting diode, which are modulated by the first wavelength from the diode and the second wavelength from the phosphor, have almost the same color temperature. The invention can thus increase yield.

The invention has another feature of forming different doses of phosphor on the corresponding light-emitting diode in the wafer form. The invention is different from the conventional method, wherein the phosphor is formed on the light-emitting die after dividing each diode of the wafer in the prior art. Therefore, each wafer can produce a greater quantity of light-emitting devices with uniform color temperature.

BRIEF DESCRIPTION OF THE DRAWINGS

This and other objects and features of the invention will become clear from the following description, taken in conjunction with the preferred embodiments with reference to the drawings, in which.

DETAILED DESCRIPTION OF THE PREFERRED EMBODIMENTS

Figure 1A:
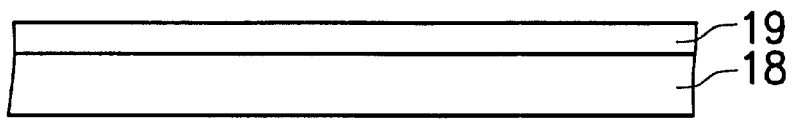
FIGS. 1A to FIG. 1G illustrate a conventional method of fabricating a light-emitting device.
Figure 1B:
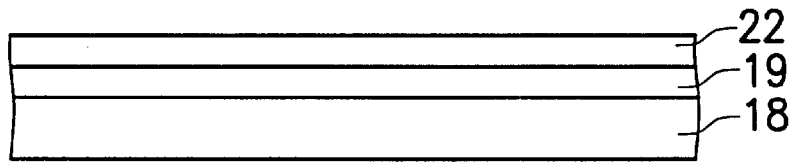
Figure 1C:
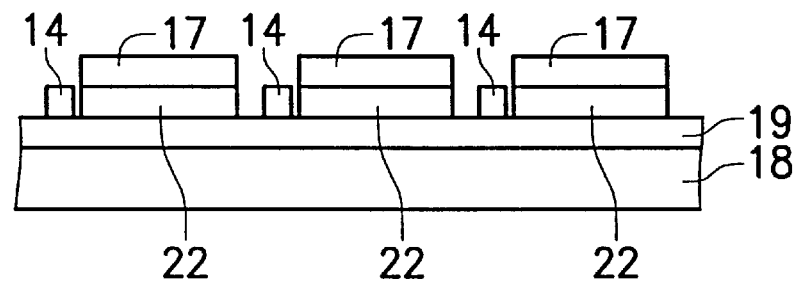
Figure 1D:
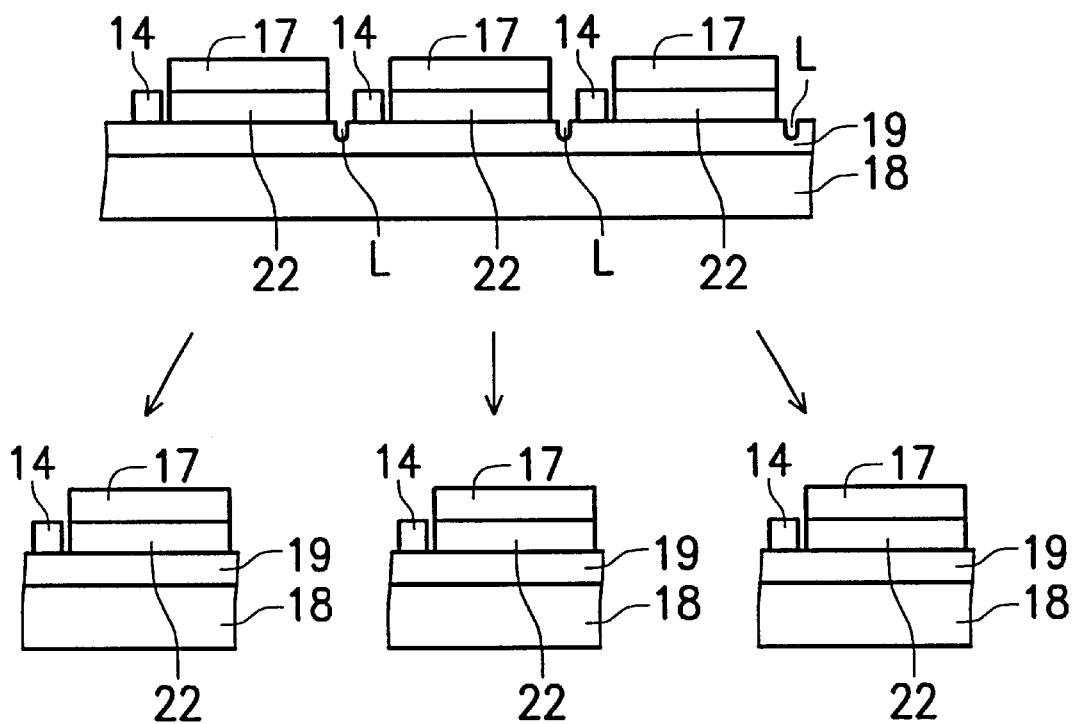
Figure 1E:
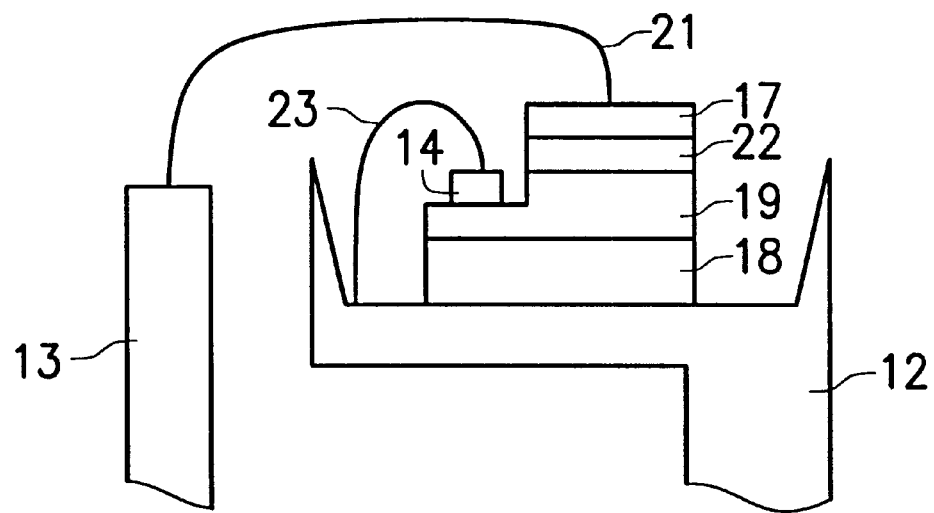
Figure 1F:
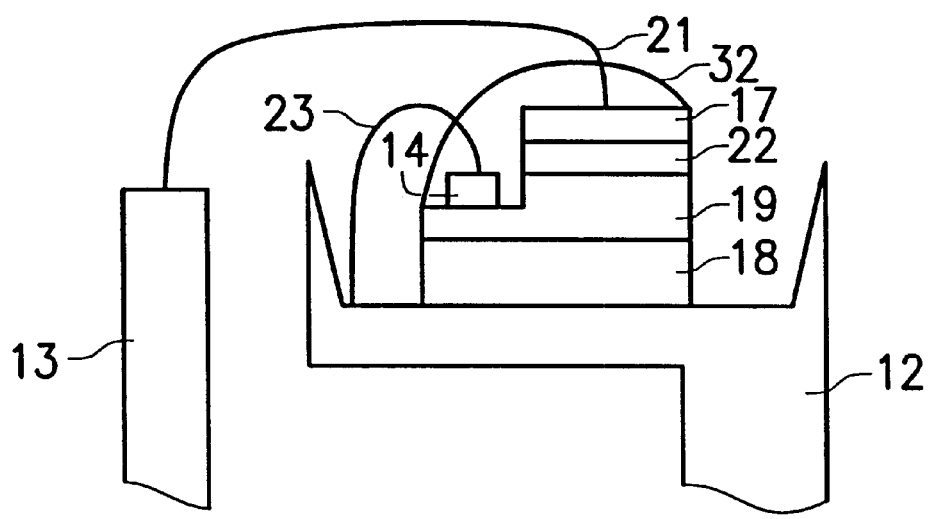
Figure 1G:
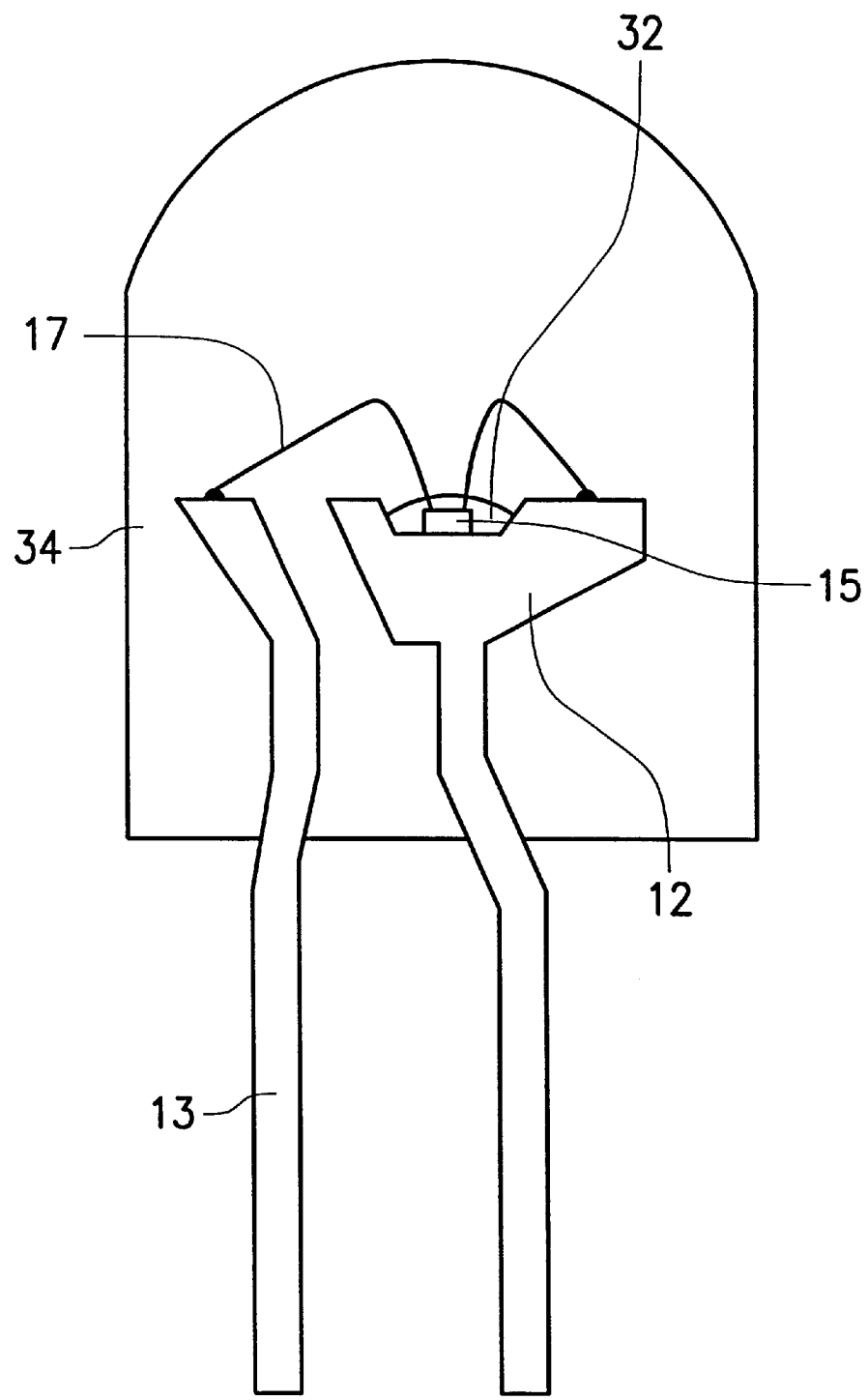
Figure 2:
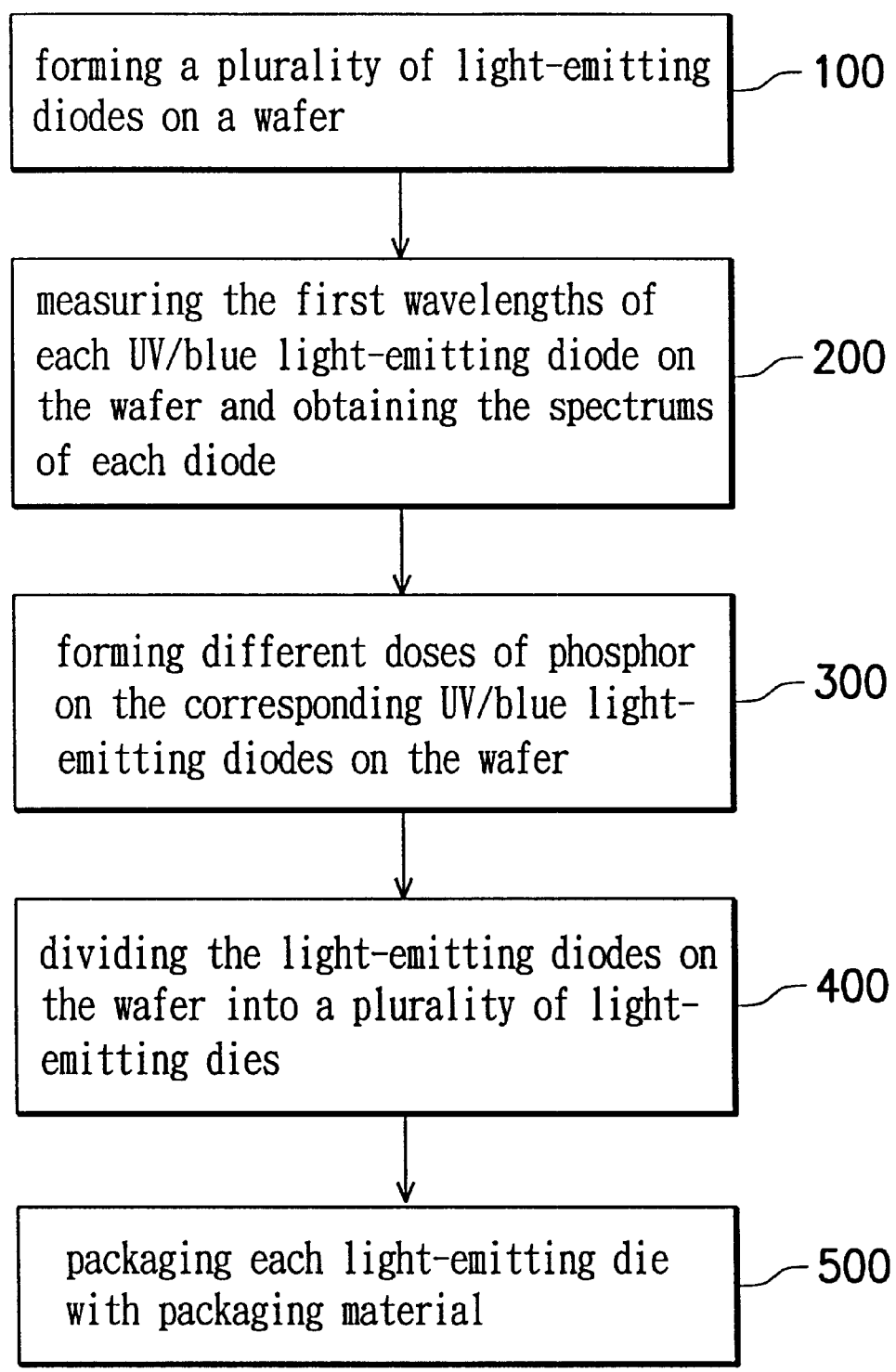
FIG. 2 schematically shows a flowchart of the embodiment of the invention.

FIG. 2 schematically shows a flowchart of the embodiment of the invention. First, the step 100 describes a plurality of light-emitting diodes forming on a wafer.

Figure 3:
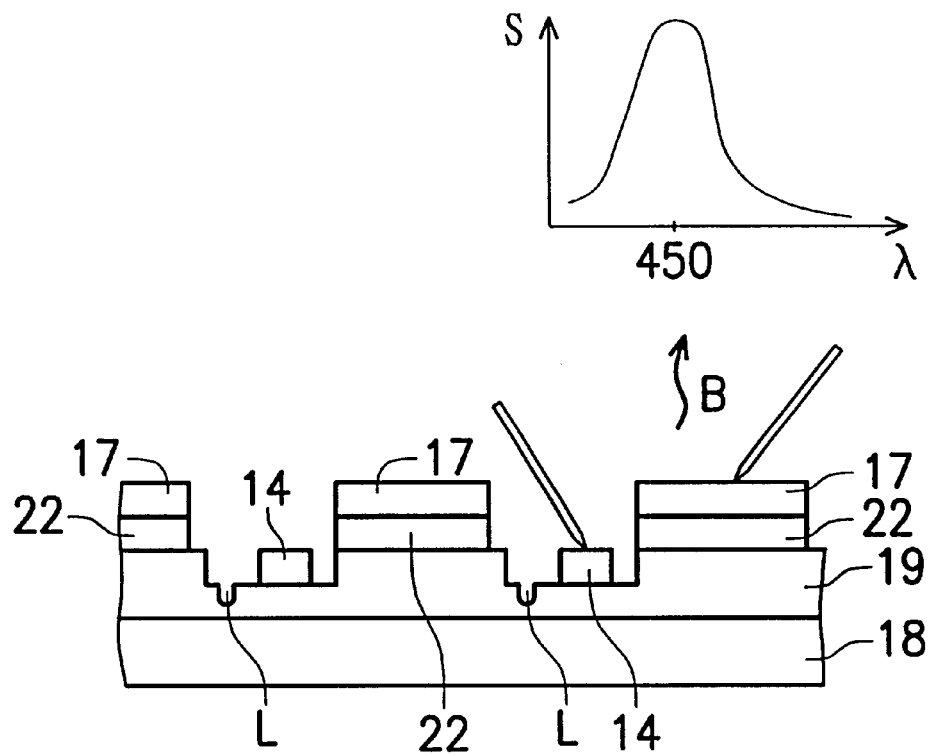
FIG. 3 schematically shows a plurality of light-emitting diodes forming on the wafer.

FIG. 3 schematically shows a plurality of light-emitting diodes formed on the wafer. As shown in FIG. 3, a plurality of UV/blue light-emitting diodes is formed on an insulating substrate 18. The UV/blue light-emitting diodes include an insulating substrate 18, a n-type cladding layer 19 forming on the insulating substrate 18, a p-type cladding layer 22 with predetermined shape forming on the n-type cladding layer 19, a plurality of p-type electrodes 24 respectively forming on each p-type cladding layer 22, and a plurality of n-type electrodes 14 respectively forming on a predetermined position of the n-type cladding layer. In general, in the UV/blue light-emitting diodes, the n-type cladding layer is made of n-type gallium nitride-based III–V group compound and the p-type cladding layer is made of p-type gallium nitride-based III–V group compound. The UV/blue light-emitting diodes formed on the wafer emit blue light, and the standard wavelength thereof is 450 nm.

Next, as shown in FIG. 2, the step 200 describes that the first wavelengths of each diode on the wafer 18 are measured. A plurality of segments L is formed on the wafer 18. Then, power is applied to each diode and a detector (not shown) measures each the light emission wavelength of each diode. For example, the p-type and n-type electrodes on each UV/blue light-emitting diode on the wafer are conducted by a threshold voltage, and each diode emits light. Therefore, the spectrums S corresponding to each UV/blue light-emitting diode on the wafer are measured.

Furthermore, according to the chromaticity diagram established by CIE in 1931 and the color matching function, the first wavelength from the UV/blue light-emitting diode of the embodiment and the second wavelength from the luminous material, such as phosphor, are superposed so as to form different color light.

Figure 4:
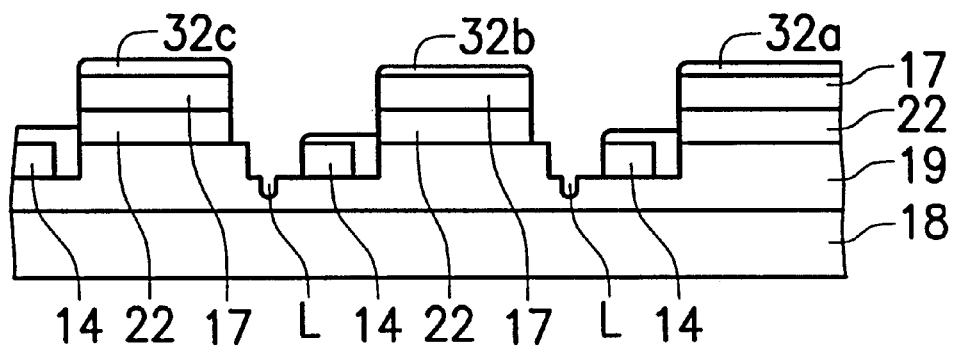
FIG. 4 schematically shows different doses of phosphor respectively forming on the corresponding light-emitting diodes.

Next, as shown in FIG. 2, the step 300 describes that the different doses of phosphor are formed on the corresponding UV/blue light-emitting diodes on the wafer according to the respective spectrums. In the embodiment, according to respective spectrums, the different doses of phosphor are formed on the corresponding light-emitting diodes by using ink jet printing. For example, when the light-emitting diode shown on the right of FIG. 4 emits a first wavelength 450 nm, i.e. standard wavelength, a standard dose of phosphor 32a is formed thereon by ink jet printing. Therefore, the color temperature of the modulated light from the diode is 6000 K. When the light-emitting diode shown in the middle of FIG. 4 emits a first wavelength 455 nm, a smaller dose of phosphor 32b is formed thereon by ink jet printing. Thus, this diode also emits white light with the same color temperature. When the light-emitting diode shown on the left of FIG. 4 emits a first wavelength 445 nm, a larger dose of phosphor 32c is formed thereon by ink jet printing. Therefore, the diode also emits white light with the same color temperature. When the first wavelength emitted from the diode is longer than the standard wavelength, the total area of the second wavelength radiated from the phosphor material is reduced so as to modulate white light with color temperature of 6000 K according to the color matching function. In other words, the dose of phosphor forming on the light-emitting diode on the wafer is reduced. When the first wavelength emitted from the diode is shorter than the standard wavelength, the total area of the second wavelength radiated from the phosphor material is increased so as to modulate white light with color temperature of 6000 K according to the color matching function. In other words, the dose of phosphor forming on the light-emitting diode on the wafer is increased. Moreover, in the embodiment of the invention, the phosphor materials are respectively formed on each surface of the diodes in wafer form by utilizing Thermal Bubble or Piezoelectric ink jet printing.

Figure 5:
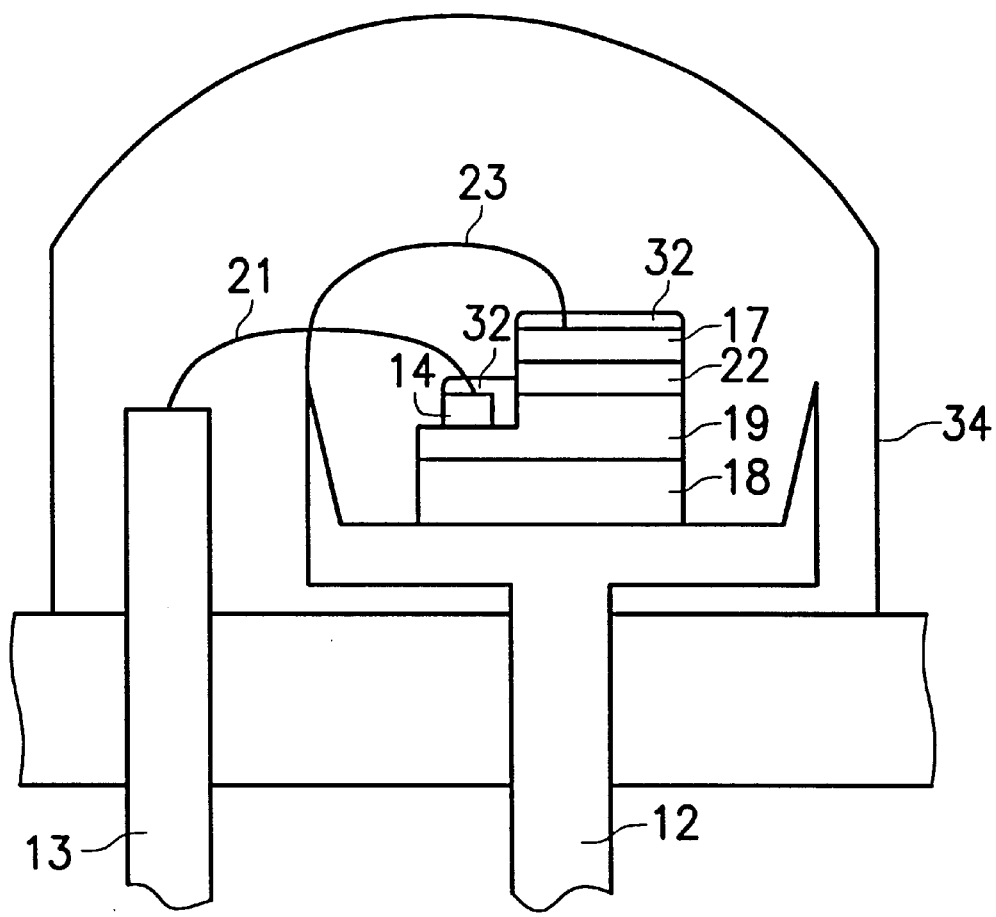
FIG. 5 schematically shows a plurality of light-emitting dies by dividing the diodes on the wafer in FIG. 4.

As shown in FIG. 2, the step 400 describes that after forming corresponding dose of phosphor for each light-emitting diode on the wafer, the diodes on the wafer are divided into a plurality of light-emitting dies. FIG. 5 schematically shows a plurality of light-emitting dies by dividing the diodes in wafer form in FIG. 4. Then, each light-emitting die is packaged by packaging material 34. For example, the light-emitting die is positioned on a first lead frame 12, wherein a wire 21 connects a p-type electrode 17 and a second lead frame 13 and another wire 23 connects a n-type electrode 14 and the first lead frame 12.

As shown in FIG. 2, the step 500 describes that each light-emitting die is packaged by packaging material. Because the packaging material can form different curvature surface for each light-emitting device, different focal lengths are obtained.

Figure 6:
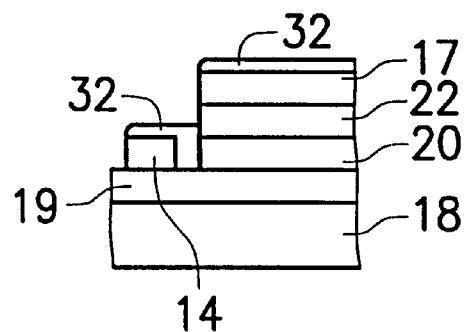
FIG. 6 schematically shows a light-emitting diode having an active layer.

As shown in FIG. 6, in the invention, an active layer 20 is further formed between the n-type cladding layer 19 and the p-type cladding layer 22 so as to increase the light intensity of the light-emitting device.

In the embodiment of the invention, many varied phosphors can be blended to form on each light-emitting die in wafer form. If two or more kinds of phosphors are blended together, two or more wavelengths will be measured. For example, two kinds of phosphors are blended together, and radiate a second wavelength and a third wavelength. In other words, the light-emitting diode emits a first wavelength, and the first and second phosphors respectively radiate a second wavelength and a third wavelength.

The invention can be applied to any kind of light-emitting diode in wafer form and phosphor materials. Therefore, the invention can provide many varied light-emitting devices with desired color temperature.

While the preferred embodiment of the present invention has been described, it is to be understood that modifications will be apparent to those skilled in the art without departing from the spirit of the invention. The scope of the invention, therefore, is to be determined solely by the following claims.

What is claimed is:

1. A method for fabricating a light-emitting diode with uniform color temperature, comprising the steps of:

forming a plurality of light-emitting diodes on a wafer;

obtaining the light emission wavelengths of the light-emitting diodes on the wafer; and forming different doses of phosphor on the corresponding light-emitting diode in wafer form according to the light emission wavelengths of respective light-emitting diodes;

wherein each light-emitting diodes emits its first wavelength and the phosphor radiates a corresponding second wavelength, and the light-emitting diodes on the wafer emit light with uniform color temperature.

2. A method for fabricating a light-emitting diode with uniform color temperature as claimed in claim 1, wherein when a first wavelength emitted from the diode is longer than the standard wavelength, the dose of phosphor forming on the light-emitting diode on the wafer is reduced.

3. A method for fabricating a light-emitting diode with uniform color temperature as claimed in claim 1, wherein when a first wavelength emitted from the diode is shorter than the standard wavelength, the dose of phosphor forming on the light-emitting diode on the wafer is increased.

4. A method for fabricating a light-emitting diode with uniform color temperature as claimed in claim 1, wherein the phosphor is respectively formed on each light-emitting diode in wafer form by utilizing ink jet printing.

5. A method for fabricating a light-emitting diode with uniform color temperature as claimed in claim 1, wherein the light-emitting diode is a gallium nitride-based III–V group light-emitting diode.

6. A method for fabricating a light-emitting diode with uniform color temperature as claimed in claim 4, wherein the ink jet printing is selected from the group consisting of Thermal Bubble ink jet printing and Piezoelectric ink jet printing.

7. A method for fabricating a light-emitting diode with uniform color temperature as claimed in claim 1, wherein the light-emitting diode is a UV/blue light-emitting diode.

8. A method for fabricating a light-emitting diode with uniform color temperature as claimed in claim 1, wherein the light-emitting diodes on the wafer emit white light with uniform color temperature.

9. A method for fabricating a light-emitting device with uniform color temperature, comprising the steps of:

forming a plurality of light-emitting diodes on a wafer;

obtaining the light emission wavelengths of the light-emitting diodes on the wafer;

forming different doses of phosphor on the corresponding light-emitting diode in wafer form according to the light emission wavelengths of respective light-emitting diodes so as to provide the light-emitting diodes with uniform color temperature on the wafer;

dividing the light-emitting diodes on the wafer into a plurality of white light-emitting dies with uniform color temperature; and obtaining the white light-emitting device with uniform color temperature by packaging the respective light-emitting dies.

10. A method for fabricating a light-emitting device with uniform color temperature as claimed in claim 9, wherein when a first wavelength emitted from the diode is longer than the standard wavelength, the dose of phosphor forming on the light-emitting diode on the wafer is reduced.

11. A method for fabricating a light-emitting device with uniform color temperature as claimed in claim 9, wherein when a first wavelength emitted from the diode is shorter than the standard wavelength, the dose of phosphor forming on the light-emitting diode on the wafer is increased.

12. A method for fabricating a light-emitting device with uniform color temperature as claimed in claim 9, wherein the phosphor is respectively formed on each light-emitting diode in wafer form by utilizing ink jet printing.

13. A method for fabricating a light-emitting device with uniform color temperature as claimed in claim 9, wherein the light-emitting diode is a gallium nitride-based III–V group light-emitting diode.

14. A method for fabricating a light-emitting device with uniform color temperature as claimed in claim 12, wherein the ink jet printing is selected from the group consisting of Thermal Bubble ink jet printing and Piezoelectric ink jet printing.

15. A method for fabricating a light-emitting device with uniform color temperature as claimed in claim 9, the light-emitting diode is a UV/blue light-emitting diode.

16. A method for fabricating a light-emitting device with uniform color temperature as claimed in claim 9, wherein the light-emitting device emits white light with uniform color temperature.

\* \* \* \* \*